United States Patent [19]
Gray et al.

[11] Patent Number: 4,961,045
[45] Date of Patent: Oct. 2, 1990

[54] FLOATING OUTPUT DIGITAL TO ANALOG CONVERTER

[75] Inventors: Randall C. Gray, Tempe, Ariz.; Arthur Edwards, Hoffman Estates, Ill.

[73] Assignee: Motorola, Inc., Schaumburg, Ill.

[21] Appl. No.: 427,552

[22] Filed: Oct. 27, 1989

[51] Int. Cl.$^5$ .............................................. G05F 1/56
[52] U.S. Cl. .................................. 323/273; 323/281; 323/349; 323/354; 341/154
[58] Field of Search ............... 323/273, 280, 281, 279, 323/349, 354; 341/144, 147, 154

[56] References Cited

U.S. PATENT DOCUMENTS

| | | | |
|---|---|---|---|
| 4,251,743 | 2/1981 | Hareyama | 323/273 |
| 4,292,625 | 9/1981 | Schoeff | 341/154 |
| 4,349,777 | 9/1982 | Mitamura | 323/281 |
| 4,354,159 | 10/1982 | Schorr et al. | 323/354 |
| 4,414,501 | 11/1983 | Bedard et al. | 323/354 |
| 4,810,948 | 3/1989 | Takuma | 323/281 |

Primary Examiner—Peter S. Wong
Attorney, Agent, or Firm—Michael D. Bingham

[57] ABSTRACT

A digital to analog converter circuit produces an output voltage which includes a small error voltage floating on a larger direct current voltage component. The circuit includes a controlled current supply coupled to the emitter of an NPN transistor to which the direct current voltage component is supplied to the base thereof. The error voltage is generated by modulating the current through the transistor by controlling the current supply, independent of the voltage component supplied to its base, such that the output voltage occurring at the emitter of the transistor is a function of the difference between the direct current component and the natural log of the modulated emitter current.

7 Claims, 1 Drawing Sheet

FLOATING OUTPUT DIGITAL TO ANALOG CONVERTER

BACKGROUND OF THE INVENTION

The present invention relates to a circuit and method for generating and error voltage onto a direct current voltage and, more particularly, to generating a digitally controlled error voltage for incrementally changing a direct current reference voltage in a regulator system.

In alternator regulators in particular and many other general applications, it is required to generate a small error voltage which floats on a much larger direct current voltage component. For example, in a switch mode operated voltage regulator system the system output may be either switched on or off depending on the level of an error voltage generated within the system. One problem which may be faced is how to generate a small error voltage on top of a relative large direct current reference voltage. One method that might be used is to use a plurality of resistors across which the reference voltage is developed. By incrementally changing the resistance values a particular error voltage could be generated that floats on the larger direct current voltage component. However, this technique requires large magnitude resistors and is therefore not suitable for use in an integrated circuit system.

Thus, a need exists for a circuit and method to generate a small incrementally varying error voltage onto a floating reference voltage which circuit is suited for manufacture in integrated circuit form.

SUMMARY OF THE INVENTION

Accordingly, it is an object of the present invention to provide improved circuitry and method for generating a small error voltage onto a much larger reference voltage component.

It is another object of the present invention to provide an improved digital to analog converter having a floating output.

In accordance with the above and other objects there is provided a circuit for producing an output voltage responsive to a current, comprising a first transistor to which a reference voltage is applied to the base thereof while the collector is coupled to source of operating potential, and a controllable current supply coupled to the emitter of the transistor for sinking a current through the transistor the magnitude of which is controlled. The controllable current supply is responsive to applied control signals for incrementally changing the magnitude of the current flowing through the transistor wherein an output voltage is produced at the emitter of the transistor the magnitude of which is equal to the value of the direct current voltage minus the base-emitter voltage of the transistor, the latter or which is varied as the current through the transistor is changed.

DETAILED DESCRIPTION OF THE PREFERRED EMBODIMENT

Figure 1:
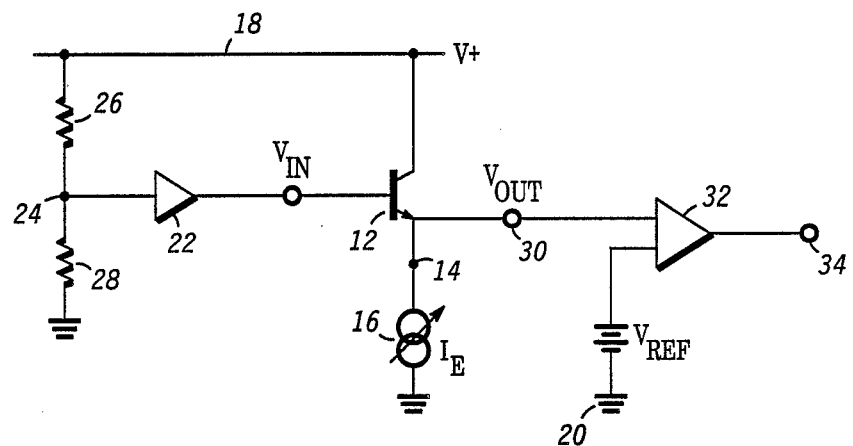
FIG. 1 is a partial block and schematic diagram of the digital to analog convertor circuit of the present invention; an FIG. 2 is a schematic diagram of the controlled current supply circuit of FIG. 1.

Turning to the Figures and, more particularly, FIG. 1, there is shown circuit 10 which is suited to be manufactured in integrated circuit form for generating an output voltage $V_{out}$ that has a small voltage variation induced onto the floating DC reference voltage $V_{in}$. Circuit 10 as will be described by way of one example may operate as a floating digital analog convertor utilizing NPN transistor 12. The emitter of transistor 12 is coupled to node 14 to which controlled current supply means 16 is coupled for sinking emitter current $I_E$ from the transistor. The collector of transistor 12 is coupled to positive supply rail 18 to which V+ is supplied while its base receives the reference voltage $V_{in}$. $V_{in}$, which may be a function of the operating potential V+, is supplied via buffer amplifier 22; the latter of which is coupled between node 24 and the base of transistor 12. A resistor divider comprising resistors 26 and 28 produces a reference voltage at node 24. If, for example, the floating digital to analog convertor circuit 10 is used in an automotive alternator regulator, the operating potential that is supplied to rail 18 is a function of the battery voltage of the automobile.

In response to modulating the value of the current $I_E$ flowing through transistor 12 the base to emitter voltage, $V_{BE}$, of the device changes which changes $V_{out}$ occurring at output 30. $V_{out}$ is therefor equal to:

$$V_{OUT}=V_{in}-V_{BE} \quad (1)$$

It is known from the ideal diode voltage-current equation that:

$$V_{BE}=V_T ln(IE/IS) \quad (2)$$

Where $V_T$ is the thermal voltage and $I_S$ is the reverse saturation current of the base-emitter PN junction.

Thus, by digitally controlling the value of $I_E$, for example, an error step voltage, waveform 58 (FIG. 3), is generated at node 30 which is induced onto the value of $V_{in}$. $I_E$ is controlled in response to receiving digital control signals D1,D2,D3 . . . DN.

This error voltage can be utilized at one input of comparator 32 while the other input receives a reference voltage $V_{REF}$ to derive a system control signal output 34 whenever the magnitude of $V_{out}$ varies above and below the value of the reference voltage.

Figure 2:
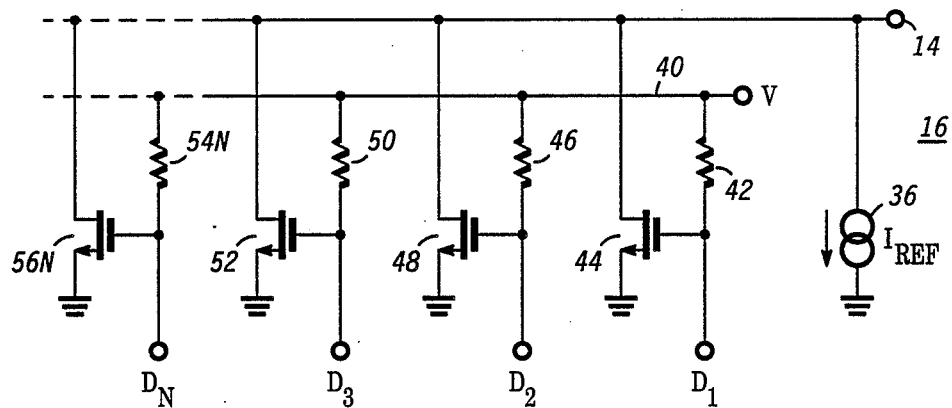

The method of controlling the current $I_E$ is illustrated in FIG. 2 wherein current supply 16 is shown as including a reference current supply 36 coupled between node 14 and ground reference in which sinks a current $I_{REF}$. Controllable current supply 16 also includes a plurality MOS transistors 44, 48, 52 . . . 56N each of which have their drain electrodes coupled to node 14 and their source electrodes coupled to ground supply. An operating potential, V, is supplied to conductor 40 which in turn is coupled to the individual gate electrodes of the MOS transistors via respective resistors 42, 46, 50 . . . 56N. The gate electrodes of the MOS transistors are also adapted to receive individual digital control signals D1, D2, D3 . . . DN.

To the first order, from equation 2, $V_{BE}$ will increase or decrease by 60 millivolts per decade of change in emitter current as is understood. For example, if $I_E$ is set at the forward conduction bias point of transistor 12, the threshold value of $V_{BE}$ is approximately 0.6 volts and $$V_{out} = V_{in} - 0.6 \tag{3}$$

Figure 3:
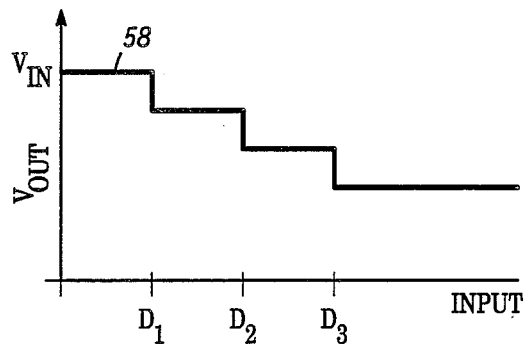
FIG. 3 is a waveform diagram useful for illustrating the operation of the present invention.

In the above example, the magnitude of $I_E$ at the threshold value is produced by having all of the MOS transistors turned on in parallel to the current $I_{REF}$. These MOS transistors are turned on if the respective digital signals D1 through DN are at a logic one. As D1 goes low, transistor 42 is turned off which decreases the magnitude of $I_E$ and hence $V_{out}$. Similarly, as the digital control signals D2, D3 etc. go low, $V_{out}$ is incrementally reduced (FIG. 3). Thus, a small error voltage is induced onto the larger direct current voltage $V_{in}$. This can been seen as the stair step waveform of $V_{out}$. It is understood that the currents flowing in the MOS transistors and $I_{REF}$ must track one another.

It should be realized that $V_{REF}$ and $V_{in}$ may be interchanged and the principle of the present invention is not changed. Furthermore, it should be understood that the MOS transistors of controllable current supply 16 may be realized by bipolar transistors.

Hence, what has been described above, is a novel circuit and method for inducing a small incremental voltage unto a larger direct current voltage component. This incremental voltage is generated by modulating the emitter current through a transistor independent of the voltage supplied at its base.

What is claimed is:

1. A circuit for providing an output voltage having a small voltage variation induced onto a larger direct current voltage component, comprising:

a first transistor having first, second and control electrodes, said control electrode being coupled to a terminal at which the direct current voltage component is supplied, said second electrode being coupled to a first power supply conductor; and controlled current supply means coupled to said first electrode of said first transistor and being responsive to control signals applied thereto for varying the magnitude of current flowing through said first transistor independently of said direct current voltage component to produce the output voltage at said first electrode.

2. The circuit of claim 1 wherein said controlled current supply means includes:

a reference current supply coupled between said first electrode and a second power supply conductor for sinking a predetermined substantially constant current; and a plurality of additional transistors each having a control electrode and first and second electrodes, each of said second electrodes of said plurality of additional transistors being coupled to said first electrode of said first transistor, each of said first electrodes being coupled to said second power supply conductor and each of said control electrodes being coupled to a respective terminal at which respective control signals are applied.

3. The circuit of claim 2 including a plurality of resistors each of which are respectively coupled between a reference terminal to which a reference voltage is applied and a respective control electrode of said plurality of additional transistors.

4. The circuit of claim 2 wherein said additional transistors are MOS transistors.

5. The circuit of claim 1 wherein said first transistor is a NPN transistor.

6. The circuit of claim 4 wherein said control signals are digital signals supplied to said respective control electrodes of said plurality of additional transistors for incrementally varying the value of the magnitude of the current flowing through said first transistor.

7. A method for generating a small variation voltage which floats on a larger direct current voltage, comprising the steps of:

applying the direct current voltage to the base of a transistor for establishing a direct current reference potential at the emitter; and modulating the current flowing through the emitter of the transistor independently of the direct current voltage applied to the base.

* * * * *